(12) United States Patent
Low et al.

(10) Patent No.: US 7,476,878 B2
(45) Date of Patent: Jan. 13, 2009

(54) TECHNIQUES FOR REDUCING EFFECTS OF PHOTORESIST OUTGASSING

(75) Inventors: Russell J. Low, Rowley, MA (US); Jonathan Gerald England, Horsham (GB); Stephen E. Krause, Ipswich, MA (US); Eric D. Hermanson, Georgetown, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 226 days.

(21) Appl. No.: 11/567,522

(22) Filed: Dec. 6, 2006

(65) Prior Publication Data

US 2007/0125957 A1   Jun. 7, 2007

Related U.S. Application Data

(60) Provisional application No. 60/748,068, filed on Dec. 7, 2005.

(51) Int. Cl.
  *H01J 37/317* (2006.01)
(52) U.S. Cl. .................................. 250/492.21
(58) Field of Classification Search ............ 250/492.21, 250/441.11, 396 R
  See application file for complete search history.

(56) References Cited

U.S. PATENT DOCUMENTS

| | | | |
|---|---|---|---|
| 4,214,853 A | 7/1980 | Mahl | |
| 4,680,474 A | 7/1987 | Turner et al. | |
| 5,375,451 A | 12/1994 | Sandstrom | |
| 5,672,882 A * | 9/1997 | Day et al. | 250/492.21 |
| 5,932,882 A | 8/1999 | England et al. | |
| 6,369,874 B1 | 4/2002 | del Puerto | |
| 6,635,880 B1 | 10/2003 | Renau | |
| 6,791,097 B2 | 9/2004 | Scheuer et al. | |
| 6,984,833 B2 * | 1/2006 | Sano et al. | 250/492.21 |
| 2004/0262542 A1 | 12/2004 | Rathmell et al. | |

OTHER PUBLICATIONS

International Search Report mailed Feb. 7, 2008.

* cited by examiner

*Primary Examiner*—Kiet T Nguyen

(57) ABSTRACT

Techniques for reducing effects of photoresist outgassing are disclosed. In one particular exemplary embodiment, the techniques may be realized as an apparatus for reducing effects of photoresist outgassing in an ion implanter. The apparatus may comprise a drift tube located between an end-station and an upstream beamline component. The apparatus may also comprise a first variable aperture between the drift tube and the end-station. The apparatus may further comprise a second variable aperture between the drift tube and the upstream beamline component. The first variable aperture and the second variable aperture can be adjusted to facilitate differential pumping.

23 Claims, 6 Drawing Sheets

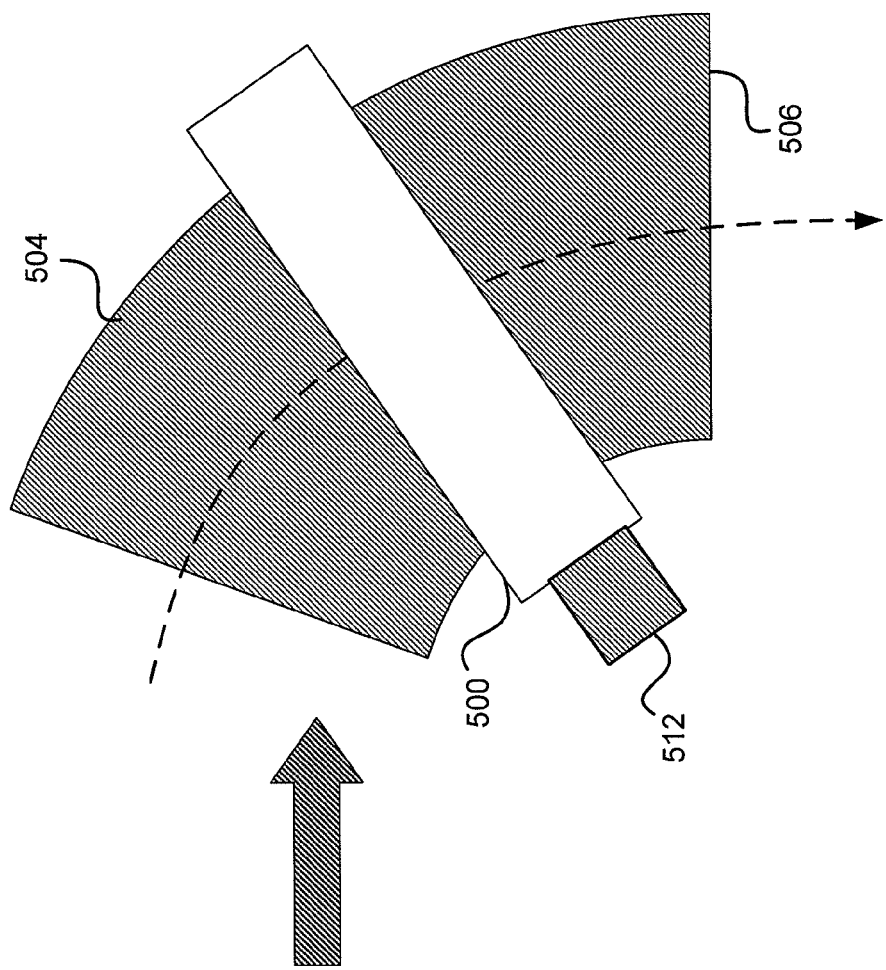
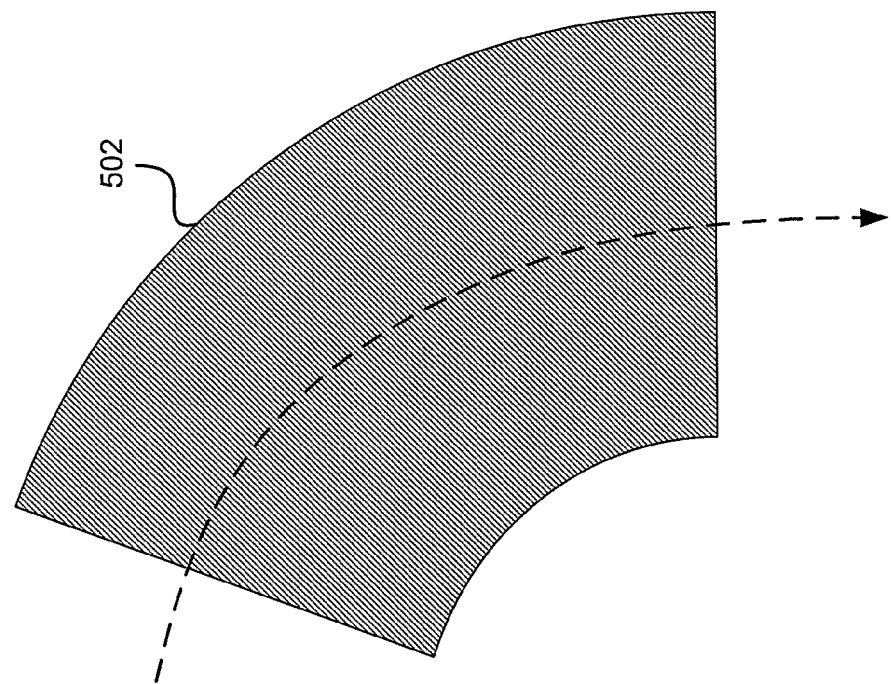
Figure 5

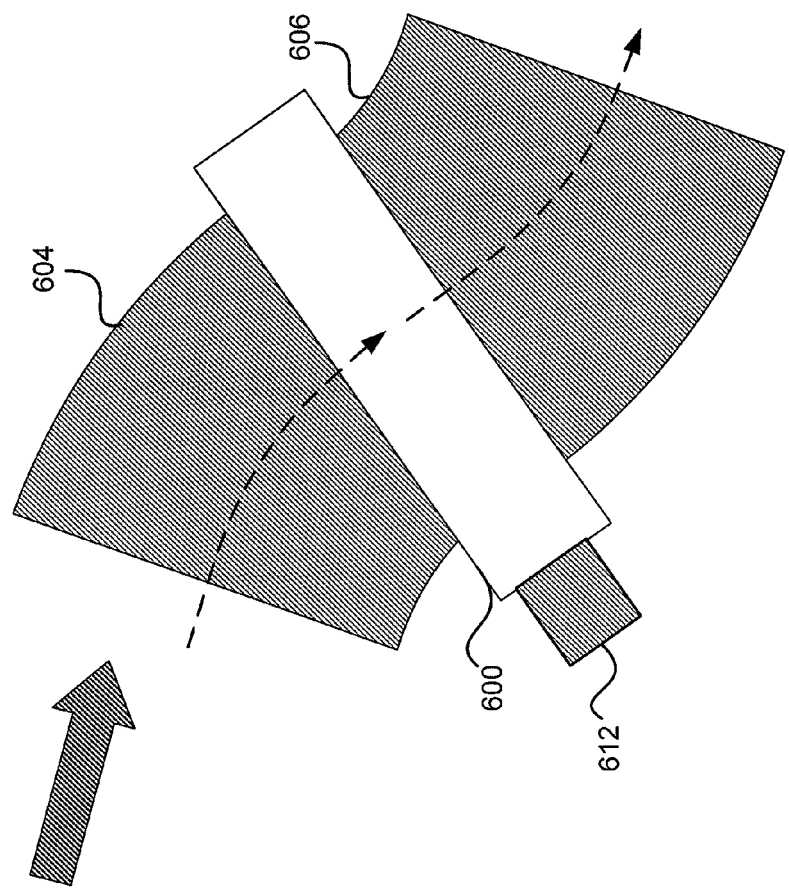
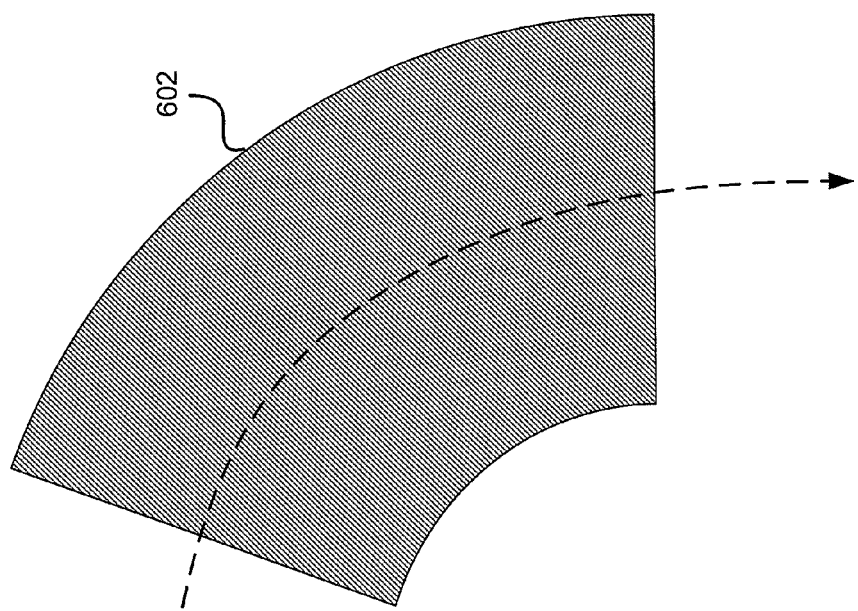
Figure 6

TECHNIQUES FOR REDUCING EFFECTS OF PHOTORESIST OUTGASSING

CROSS-REFERENCE TO RELATED APPLICATIONS

This patent application claims priority to U.S. Provisional Patent Application No. 60/748,068, filed Dec. 7, 2005, which is hereby incorporated by reference herein in its entirety.

This patent application is related to U.S. Patent Application entitled "Techniques for Preventing Parasitic Beamlets from Affecting Ion Implantation," filed Dec. 6, 2006, which is hereby incorporated by reference herein in its entirety.

FIELD OF THE DISCLOSURE

The present disclosure relates generally to semiconductor manufacturing and, more particularly, to techniques for reducing effects of photoresist outgassing.

BACKGROUND OF THE DISCLOSURE

Ion implanters are widely used in semiconductor manufacturing to selectively alter the conductivity of materials. In a typical ion implanter, ions generated from an ion source are transported downstream through a series of beamline components which may include one or more analyzer and/or corrector magnets and a plurality of electrodes. The analyzer magnets may be used to select desired ion species and filter out contaminant species or ions having undesirable energies. The corrector magnets may be used to manipulate the shape of the ion beam or otherwise adjust the ion beam quality before it reaches a target wafer. Suitably shaped electrodes can be used to modify the energy and the shape of the ion beam. After the ion beam has been transported through the series of beamline components, it may be directed into an end station to perform ion implantation.

FIG. 1 depicts a conventional ion implanter system 100. As is typical for most ion implanters, the system 100 is housed in a high-vacuum environment. The ion implanter system 100 may comprise an ion source 102 and a series of beamline components through which an ion beam 10 passes. The series of beamline components may include, for example, an extraction manipulator 104, a filter magnet 106, an acceleration or deceleration column 108, an analyzer magnet 110, a rotating mass slit 112, a scanner 114, and a corrector magnet 116. Much like a series of optical lenses that manipulate a light beam, the ion implanter components can filter and focus the ion beam 10 before steering it towards a target wafer 118. The target wafer 118 is typically housed in a wafer end-station (not shown) under high vacuum.

In semiconductor manufacturing, ion implantation of a target wafer is often performed on only selected areas of the wafer surface, while the rest of the wafer surface is typically masked with a photosensitive material known as "photoresist." Through a photolithography process, the target wafer may be coated with a patterned layer of photoresist material, exposing only selected areas of the wafer surface where ion implantation is desired. During ion implantation, an ion beam makes its impact not only on the exposed portion of the wafer surface, but also on the photoresist layer. The energetic ions often break up chemical bonds within the photoresist material and release volatile organic chemicals and/or other particles into the vacuum chamber (i.e., wafer end-station) that houses the target wafer. This phenomenon is known as "photoresist outgassing."

Photoresist outgassing in an ion implanter can have several deleterious effects on an ion beam. For example, the particles released from the photoresist may cause a pressure increase or pressure fluctuations in the high-vacuum wafer end-station. The outgassed particles may also migrate upstream from the wafer end-station to other beamline components, such as the corrector magnet 116 and the scanner 114 as shown in FIG. 1, and may affect vacuum levels in those portions of the ion implanter as well.

The outgassed particles often interact with an incident ion beam, for example, by exchanging charges with beam ions. As a result, an ion with a single positive charge may lose its charge to an outgassed particle and become neutralized; a doubly charged ion may lose one positive charge to an outgassed particle and become singly charged; and so on. As a result, the outgassing-induced charge exchange can interfere with the ion dosimetry system in the ion implanter. A typical ion dosimetry system determines ion doses by integrating a measured beam current over time and converting the integrated beam current (i.e., total ion charges) to a total dose based on an assumption that a particular ion species has a known charge state. The outgassing-induced charge exchange, however, randomly alters the charge state of the ion species, thereby invalidating the charge-state assumption that the ion dosimetry system relies on. For example, if the outgassed particles tend to rob positive charges from positive ions, then such charge exchange will cause the dosimetry system to undercount that ion species, which in turn leads to an over-supply of that ion species to a target wafer.

Due to the above-mentioned upstream migration of outgassed particles, some of the charge exchange may occur in a corrector magnet. Charge-altered ions are subject to a different Lorentz force as compared to those same species of ions that experience no charge exchange. As such, the charge-altered ions will deviate from the main ion beam path, resulting in non-uniform dosing of the target wafer. Beamlets formed by streams of the charge-altered ions are referred to hereinafter as "parasitic beamlets." Apart from generating the parasitic beamlets, the charge exchange can also alter energies and angles of the affected ions, both of which will affect the ultimate dopant profile in the target wafer.

As those skilled in the art will readily appreciate, the above-described parasitic beamlet problems may similarly arise in an ion implanter running a molecular ion beam. Interactions of the molecular ion beam with residual gases in the ion implanter may cause molecular breakups, resulting in ions with altered charges as well as altered masses. Therefore, the molecular breakups can also introduce contamination to the ion implantation process.

A number of techniques have been developed to alleviate the effects of outgassing-induced charge exchange. For example, to compensate for the effect of charge exchange on dosimetry, it has been proposed that an direct current (DC) offset be included in the beam current integration process, the DC offset being correlated to a gas pressure in the wafer end-station. However, this dosimetry compensation approach only addresses one aspect of the problems caused by parasitic beamlets.

According to another approach, the above-mentioned pressure fluctuation caused by photoresist outgassing may be mitigated by bleeding inert gases into a wafer end-station in an amount much greater than the level of outgassing. While this method might stabilize the gas pressure in the wafer end-station, the resulting higher-than-optimum pressure may negatively affect the ion implantation.

According to yet another approach as illustrated in FIG. 2, a conductance-limiting aperture 202 may be provided between a wafer end-station 204 and beamline components 206. The conductance-limiting aperture 202 is typically a fixed aperture that is just wide enough to allow a scanned ion beam 20 to pass through. The conductance-limiting aperture 202 is intended to serve two purposes, i.e., to reduce an upstream migration of outgassed particles and to block parasitic beamlets from entering the wafer end-station 204. However, since the conductance-limiting aperture 202 has to be wider than the diameter of a target wafer 208, this approach can achieve only limited success in reducing conductance of outgassed particles or blocking parasitic beamlets.

In view of the foregoing, it would be desirable to provide a solution to reduce effects of photoresist outgassing which overcomes the above-described inadequacies and shortcomings.

SUMMARY OF THE DISCLOSURE

Techniques for reducing effects of photoresist outgassing are disclosed. In one particular exemplary embodiment, the techniques may be realized as an apparatus for reducing effects of photoresist outgassing in an ion implanter. The apparatus may comprise a drift tube located between an end-station and an upstream beamline component. The apparatus may also comprise a first variable aperture between the drift tube and the end-station. The apparatus may further comprise a second variable aperture between the drift tube and the upstream beamline component. The first variable aperture and the second variable aperture can be adjusted to facilitate differential pumping.

In accordance with other aspects of this particular exemplary embodiment, the first variable aperture and the second variable aperture can be adjusted, based on at least one dimension of an ion beam, to allow at least a portion of the ion beam pass through.

In accordance with further aspects of this particular exemplary embodiment, the apparatus may further comprise an array of cryogenically cooled panels located inside the drift tube, the cryogenically cooled panels capturing at least a portion of particles migrating upstream from the end-station. In addition, the first variable aperture can be fully closed to isolate the drift tube from the end-station during regeneration of the cryogenically cooled panels, and the second variable aperture can be fully closed to isolate the drift tube from the upstream beamline component during regeneration of the cryogenically cooled panels.

In accordance with additional aspects of this particular exemplary embodiment, the apparatus may further comprise one or more cryogenically cooled panels deployed near one or more locations in the end-station where outgassed particles are concentrated. The apparatus may also comprise a plurality of baffles that direct the outgassed particles towards the one or more cryogenically cooled panels.

In accordance with another aspect of this particular exemplary embodiment, the upstream beamline component may comprise a corrector magnet. The apparatus may further comprise an intermediate vacuum chamber located between a first portion of the corrector magnet and a second portion of the corrector magnet and one or more pumping elements coupled to the intermediate vacuum chamber to enhance a vacuum level associated with the corrector magnet. The first portion of the corrector magnet and the second portion of the corrector magnet may cause ion trajectories to bend in a same direction. Alternatively, the first portion of the corrector magnet and the second portion of the corrector magnet may cause ion trajectories to bend in opposite directions.

In another particular exemplary embodiment, the techniques may be realized as a method for reducing effects of photoresist outgassing. The method may comprise positioning a drift tube between an end-station and an upstream beamline component. The method may also comprise adjusting a first variable aperture between the drift tube and the end-station and a second variable aperture between the drift tube and the upstream beamline component to facilitate differential pumping.

In accordance with other aspects of this particular exemplary embodiment, the method may further comprise adjusting the first variable aperture and the second variable aperture, based on at least one dimension of an ion beam, to allow at least a portion of the ion beam pass through.

In accordance with further aspects of this particular exemplary embodiment, the method may further comprise deploying an array of cryogenically cooled panels inside the drift tube to capture at least a portion of particles migrating upstream from the end-station. The method may additionally comprise fully closing the first variable aperture to isolate the drift tube from the end-station during regeneration of the cryogenically cooled panels, and fully closing the second variable aperture to isolate the drift tube from the upstream beamline component during regeneration of the cryogenically cooled panels.

In accordance with additional aspects of this particular exemplary embodiment, the method may further comprise deploying one or more cryogenically cooled panels near one or more locations in the end-station where outgassed particles are concentrated. The method may additionally comprise providing a plurality of baffles that direct the outgassed particles towards the one or more cryogenically cooled panels.

In accordance with another aspect of this particular exemplary embodiment, the upstream beamline component comprises a corrector magnet. The method may further comprise inserting an intermediate vacuum chamber between a first portion of the corrector magnet and a second portion of the corrector magnet and pumping the intermediate vacuum chamber to enhance a vacuum level associated with the corrector magnet.

In yet another particular exemplary embodiment, the techniques may be realized as at least one signal embodied in at least one carrier wave for transmitting a computer program of instructions configured to be readable by at least one processor for instructing the at least one processor to execute a computer process for performing the method as recited above.

In still another particular exemplary embodiment, the techniques may be realized as at least one processor readable carrier for storing a computer program of instructions configured to be readable by at least one processor for instructing the at least one processor to execute a computer process for performing the method as recited above.

In a further particular exemplary embodiment, the techniques may be realized as an apparatus for reducing effects of photoresist outgassing in an ion implanter. The apparatus may comprise an intermediate vacuum chamber located between a first portion of a magnet and a second portion of the magnet. The apparatus may also comprise one or more pumping elements coupled to the intermediate vacuum chamber to enhance a vacuum level associated with the magnet.

In accordance with other aspects of this particular exemplary embodiment, the first portion of the magnet and the second portion of the magnet may cause ion trajectories to bend in a same direction.

In accordance with further aspects of this particular exemplary embodiment, the first portion of the magnet and the second portion of the magnet may cause ion trajectories to bend in opposite directions.

In yet a further particular exemplary embodiment, the techniques may be realized as a method for reducing effects of photoresist outgassing in an ion implanter. The method may comprise providing a first portion of a magnet and a second portion of the magnet. The method may also comprise positioning an intermediate vacuum chamber between the first portion and the second portion. The method may further comprise pumping the intermediate vacuum chamber to enhance a vacuum level associated with the magnet.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 5 shows an exemplary implementation of an intermediate vacuum chamber in accordance with an embodiment of the present disclosure.

FIG. 6 shows another exemplary implementation of an intermediate vacuum chamber in accordance with an embodiment of the present disclosure.

DETAILED DESCRIPTION OF EXEMPLARY EMBODIMENTS

Embodiments of the present disclosure provide various techniques for reducing effects of photoresist outgassing during ion implantation based on differential pumping and cryogenic pumping arrangements. An intermediate vacuum chamber may separate a wafer end-station from an upstream component, and a cascaded differential pumping scheme may be implemented among the wafer end-station, the intermediate vacuum chamber, and the upstream component. According to some embodiments, a cryogenically cooled drift tube may allow downstream transport of an ion beam but reduce upstream flow of the outgassed particles.

Figure 1:
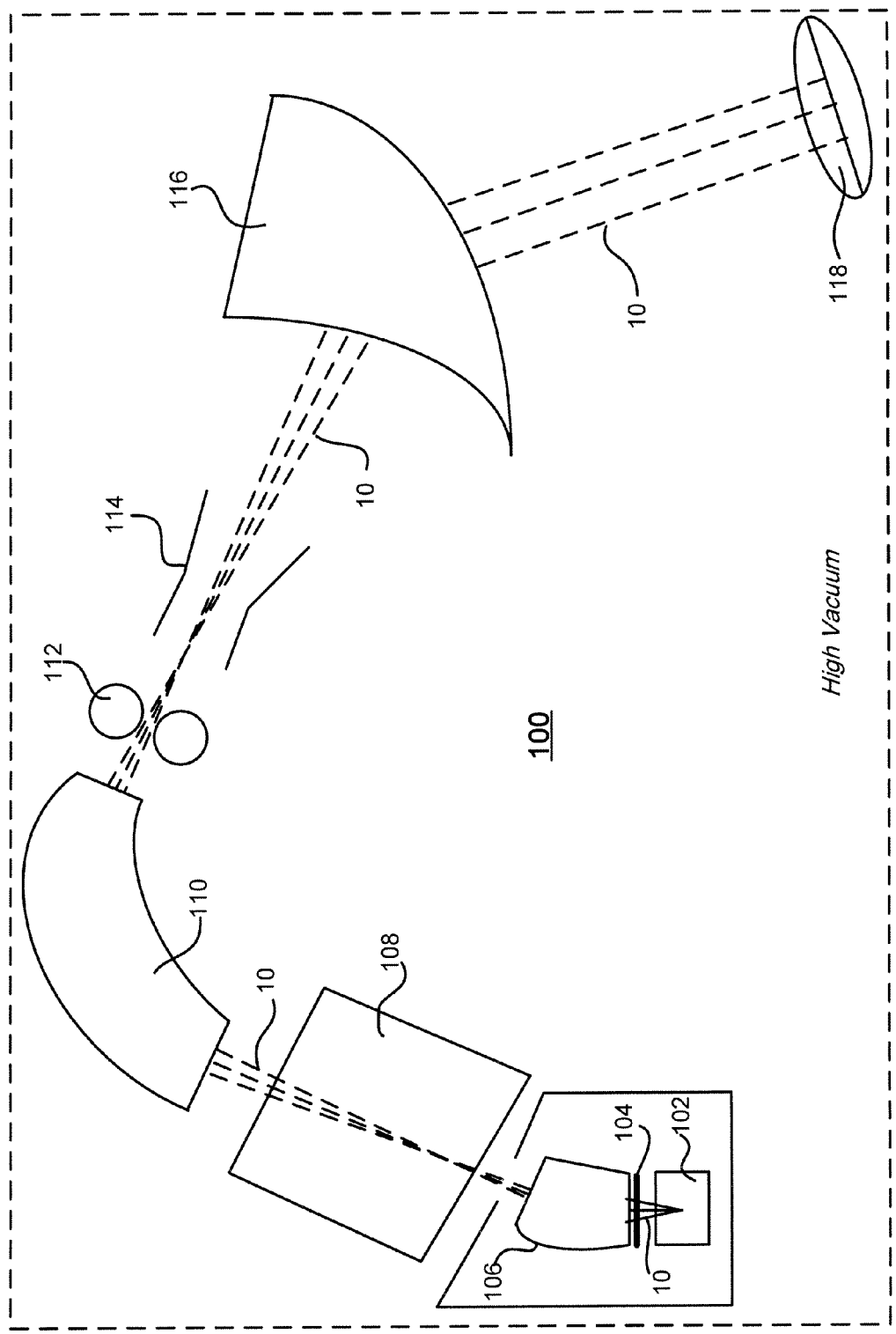
FIG. 1 shows an existing ion implanter.
Figure 2:
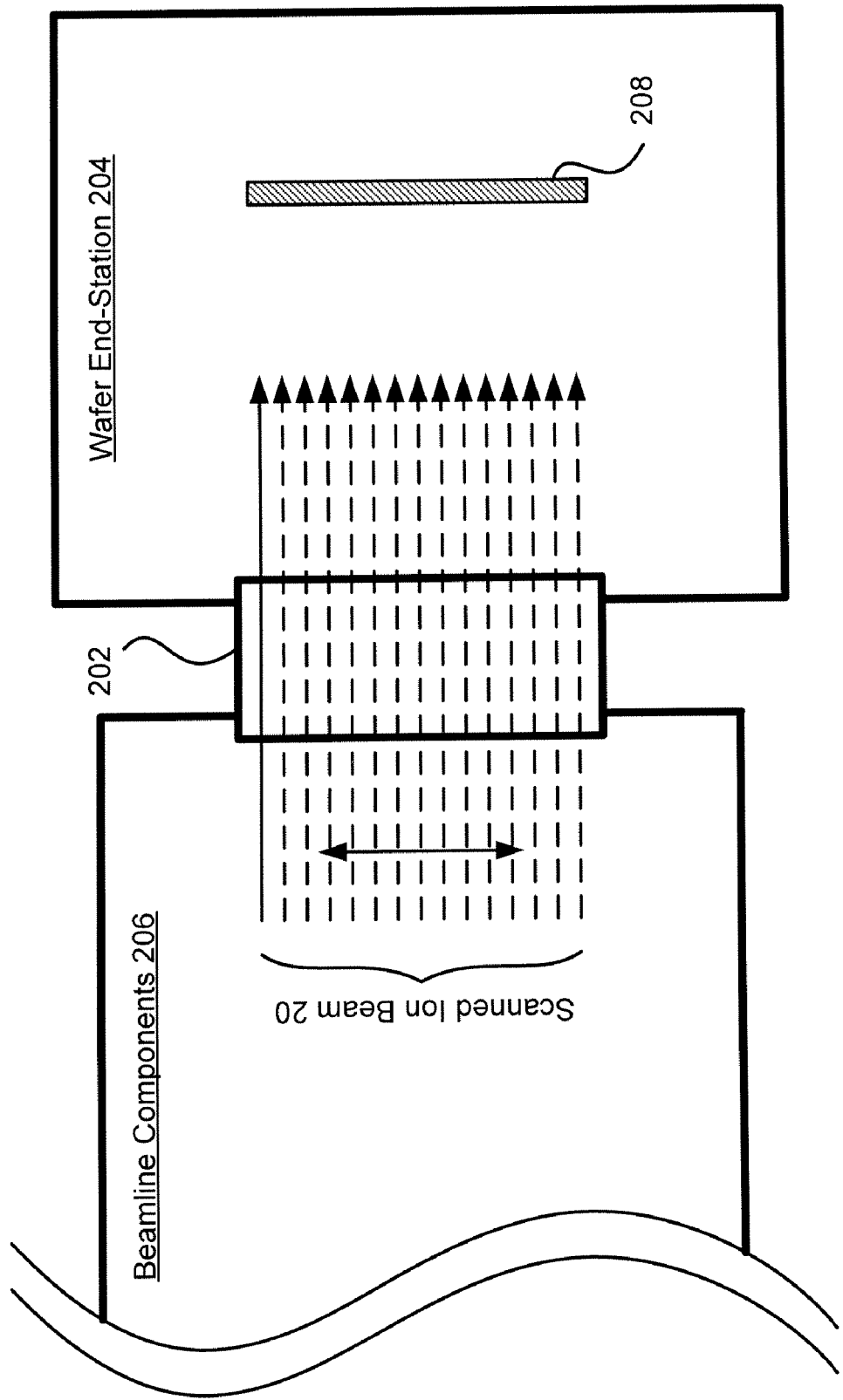
FIG. 2 illustrates an existing method for reducing effects of photoresist outgassing.
Figure 3:
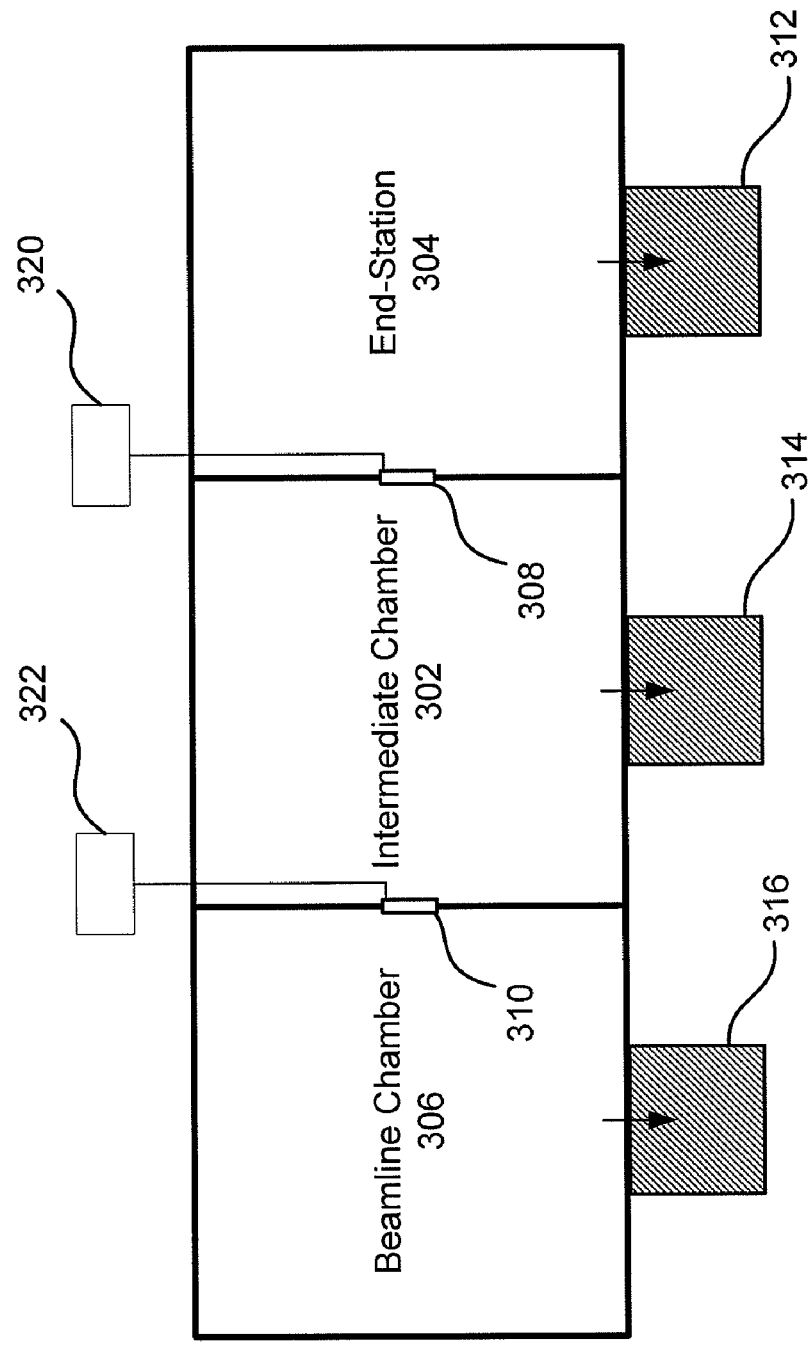
FIG. 3 illustrates an exemplary differential pumping method for reducing outgassed particles in accordance with an embodiment of the present disclosure.

Referring to FIG. 3, there is illustrated an exemplary differential pumping method for reducing outgassed particles in accordance with an embodiment of the present disclosure. In this embodiment, a two-stage differential pumping scheme is implemented with an intermediate vacuum chamber 302 separating an end-station 304 and a beamline chamber 306. The beamline chamber 306 may house, for example, a corrector magnet (not shown). A first aperture 308 may limit conductance between the intermediate vacuum chamber 302 and the end-station 304. A second aperture 310 may limit conductance between the intermediate vacuum chamber 302 and the beamline chamber 306. Preferably, the first aperture 308 and the second aperture 310 have variable openings such that they may be adjusted based on desired conductance as well as beam height and/or beam width. An actuator 320, 322 for each respective aperture 308, 310 may control adjustments of the variable openings for each aperture 308, 310. The three vacuum chambers may be respectively pumped by pumping elements 312, 314 and 316. A gas pressure due to photoresist outgassing may be progressively lowered from the end-station 304 to the beamline chamber 306. The differential pumping may stop the outgassed particles from reaching the last active component (e.g., corrector magnet) in the beamline or otherwise minimize gas pressure in the system.

During ion implantation, the pumping element 312 may be a first line of defense against an upstream migration of the outgassed particles by removing at least a portion of the outgassed particles from the end-station 304. Some of the outgassed particles may escape to the intermediate vacuum chamber 302, where the pumping element 314 may form a second line of defense against the outgassed particles. Any residual particles that wander into the beamline chamber 306 may be quickly removed by the pumping element 316. Operation of the pumping elements 312, 314 and 316 may be carefully coordinated and the variable apertures 308 and 310 adjusted to maintain a desired pressure differential among the end-station 304, the intermediate vacuum chamber 302, and the beamline chamber 306. As a result of this configuration, a substantial portion, if not all, of the outgassed particles may be prevented from reaching the beamline elements that are upstream from the end-station 304.

The intermediate vacuum chamber 302 may be dedicated to differential pumping only. Alternatively, the intermediate vacuum chamber 302 may house one or more beamline components such as a deceleration lens. According to one embodiment, pumping of the intermediate vacuum chamber 302 may be performed through a magnet pole piece, or a magnet pole piece may be converted to a cold surface for cryogenic pumping.

Figure 4:
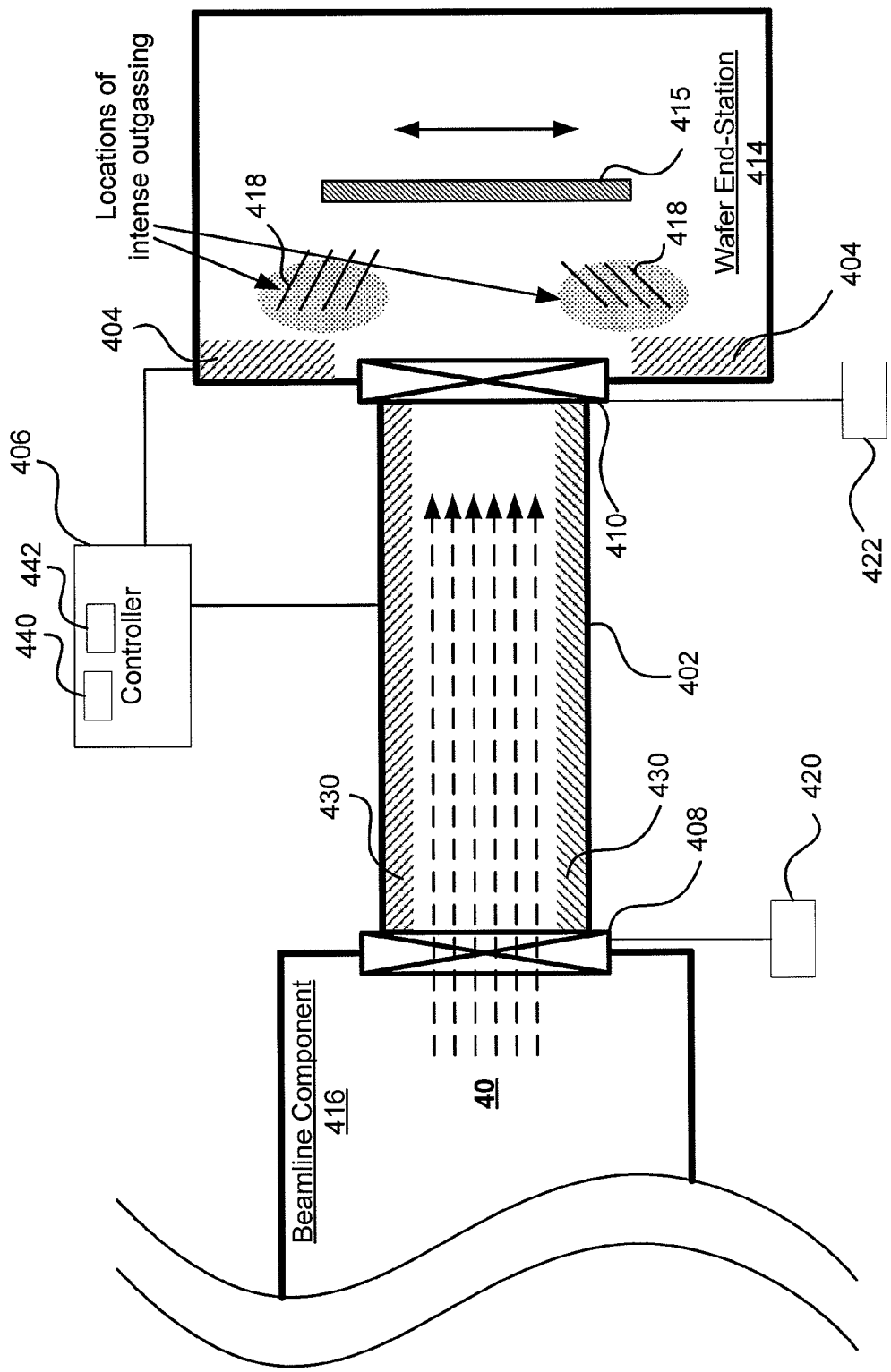
FIG. 4 illustrates an exemplary method for reducing outgassed particles with strategically placed cryogenic pumping elements in accordance with an embodiment of the present disclosure.

FIG. 4 illustrates another exemplary method for reducing outgassed particles with strategically placed cryogenic pumping elements in accordance with an embodiment of the present disclosure. A drift tube 402 may be located between a wafer end-station 414 and an upstream beamline component 416. The wafer end-station 414 may house a wafer 415 that can be mechanically scanned with respect to an incoming ion beam 40. The upstream beamline component 416 may be a corrector magnet or other beamline elements through which the ion beam 40 passes before entering the wafer end-station 414.

The drift tube 402 may be wide enough to allow the ion beam 40 to pass through. The drift tube 402 may be cryogenically pumped by an array of cryogenically cooled panels 430 located inside the drift tube 402. The panels may provide a desired amount of cold surface area for pumping purposes. Cryogenic pumping of the drift tube 402 may be managed by a controller 406.

A first valve/aperture 408 may be provided between the beamline component 416 and the drift tube 402. A second valve/aperture 410 may be provided between the drift tube 402 and the wafer end-station 414. Each valve/aperture may be implemented with a single mechanism that serves dual purposes. On the one hand, each of the valves/apertures 408 and 410 may function as a variable aperture that may be adjusted for a desired conductance and/or according to the height/width of the ion beam 40. On the other hand, each of the valves/apertures 408 and 410 may function as a gate valve that can be closed off to isolate the drift tube 402 during regeneration of the cryogenic panels, so as to reduce the amount of time needed for warming and cooling the drift tube 402. An actuator 420, 422 for each respective valve/aperture 408, 410 may control such adjustments of the openings for each valve/aperture 408, 410.

According to some embodiment, it may be desirable to implement one or more additional cryogenic pumping elements for the wafer end-station 414. Pumping of outgassed particles from the wafer end-station 414 may be substantially improved by first determining one or more locations of intense outgassing. Due to a scanning movement of the wafer 415, as well as the time it takes for outgassed particles to permeate through a photoresist layer and emanate into the wafer end-station 414, the outgassed particles may tend to concentrate in front of the wafer 415 but to either side of the ion beam 40, for example, at the locations as shown in FIG. 4. Accordingly, cryogenic cooled panels 404 may be strategically placed near these locations of intense outgassing, such that the outgassed particles may be more effectively evacuated. According to some embodiments, it may be desirable to provide baffles 418 to direct outgassed particles away from the direction of the drift tube 402 and towards the cryogenic cooled panels 404. The baffles 418 may also be mounted on a variable aperture (not shown) leading into the wafer end-station 414.

According to some embodiments, in order to improve vacuum level associated with beamline elements, such as in the beamline chamber 306 as shown in FIG. 3, a magnet may be split into two parts, and an intermediate vacuum chamber may be inserted between the two parts. This configuration may be advantageous because magnets are typically difficult to pump due to the small gaps between the poles. The small pole gaps tend to prevent effective pumping by vacuum pumps located upstream or downstream from the magnet. A dedicated vacuum chamber in the magnet location may enhance vacuum level associated with the magnet.

FIG. 5 shows an exemplary implementation of an intermediate vacuum chamber in accordance with an embodiment of the present disclosure. In this embodiment, a 70° corrector magnet 502 may be split into two parts 504 and 506. The two new magnets 504 and 506 may maintain the overall arc shape similar to the original corrector magnet 502. An intermediate vacuum chamber 500 may be inserted between the magnets 504 and 506. The intermediate vacuum chamber 500 may support differential pumping and/or house beamline element(s). The intermediate vacuum chamber 500 may be pumped by pumping element 512.

FIG. 6 shows another exemplary implementation of an intermediate vacuum chamber in accordance with an embodiment of the present disclosure. In this embodiment, a corrector magnet 602 is split into two parts, and an intermediate vacuum chamber 600 may be inserted between the resultant magnets 604 and 606. In contrast to the embodiment shown in FIG. 5, the magnet 606 may be flipped so that the magnets 604 and 606 form a sigmoid shape. The intermediate vacuum chamber 600 may be pumped by pumping element 612.

At this point it should be noted that the techniques for reducing effects of photoresist outgassing in accordance with the present disclosure as described above typically involve the processing of input data and the generation of output data to some extent. This input data processing and output data generation may be implemented in hardware or software. For example, specific electronic components may be employed in an ion implanter or similar or related circuitry for implementing the functions associated with reducing effects of photoresist outgassing in accordance with the present disclosure as described above. Alternatively, one or more processors, e.g., processor 440, operating in accordance with stored instructions may implement the functions associated with reducing effects of photoresist outgassing in accordance with the present disclosure as described above. If such is the case, it is within the scope of the present disclosure that such instructions may be stored on one or more processor readable carriers 442 (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for reducing effects of photoresist outgassing in an ion implanter, the apparatus comprising:
   a drift tube located between an end-station and an upstream beamline component;
   a first variable aperture between the drift tube and the end-station; and
   a second variable aperture between the drift tube and the upstream beamline component;
   wherein the first variable aperture and the second variable aperture can be adjusted to facilitate differential pumping.

2. The apparatus according to claim 1, wherein the first variable aperture and the second variable aperture can be adjusted, based on at least one dimension of an ion beam, to allow at least a portion of the ion beam pass through.

3. The apparatus according to claim 1, further comprising:
   an array of cryogenically cooled panels located inside the drift tube, the cryogenically cooled panels capturing at least a portion of particles migrating upstream from the end-station.

4. The apparatus according to claim 3, wherein:
   the first variable aperture can be fully closed to isolate the drift tube from the end-station during regeneration of the cryogenically cooled panels; and
   the second variable aperture can be fully closed to isolate the drift tube from the upstream beamline component during regeneration of the cryogenically cooled panels.

5. The apparatus according to claim 1, further comprising:
   one or more cryogenically cooled panels deployed near one or more locations in the end-station where outgassed particles are concentrated.

6. The apparatus according to claim 5, further comprising:
   a plurality of baffles that direct the outgassed particles towards the one or more cryogenically cooled panels.

7. The apparatus according to claim 1, wherein the upstream beamline component comprises a corrector magnet.

8. The apparatus according to claim 7, further comprising:
an intermediate vacuum chamber located between a first portion of the corrector magnet and a second portion of the corrector magnet; and
one or more pumping elements coupled to the intermediate vacuum chamber to enhance a vacuum level associated with the corrector magnet.

9. The apparatus according to claim 8, wherein the first portion of the corrector magnet and the second portion of the corrector magnet cause ion trajectories to bend in a same direction.

10. The apparatus according to claim 8, wherein the first portion of the corrector magnet and the second portion of the corrector magnet cause ion trajectories to bend in opposite directions.

11. A method for reducing effects of photoresist outgassing, the method comprising the steps of:
positioning a drift tube between an end-station and an upstream beamline component; and
adjusting a first variable aperture between the drift tube and the end-station and a second variable aperture between the drift tube and the upstream beamline component to facilitate differential pumping.

12. The method according to claim 11, further comprising:
adjusting the first variable aperture and the second variable aperture, based on at least one dimension of an ion beam, to allow at least a portion of the ion beam pass through.

13. The method according to claim 11, further comprising:
deploying an array of cryogenically cooled panels inside the drift tube to capture at least a portion of particles migrating upstream from the end-station.

14. The method according to claim 13, further comprising:
fully closing the first variable aperture to isolate the drift tube from the end-station during regeneration of the cryogenically cooled panels; and
fully closing the second variable aperture to isolate the drift tube from the upstream beamline component during regeneration of the cryogenically cooled panels.

15. The method according to claim 11, further comprising:
deploying one or more cryogenically cooled panels near one or more locations in the end-station where outgassed particles are concentrated.

16. The method according to claim 15, further comprising:
providing a plurality of baffles that direct the outgassed particles towards the one or more cryogenically cooled panels.

17. The method according to claim 11, wherein the upstream beamline component comprises a corrector magnet.

18. The method according to claim 17, further comprising:
inserting an intermediate vacuum chamber between a first portion of the corrector magnet and a second portion of the corrector magnet; and
pumping the intermediate vacuum chamber to enhance a vacuum level associated with the corrector magnet.

19. At least one processor readable carrier for storing a computer program of instructions configured to be readable by at least one processor for instructing the at least one processor to execute a computer process for performing the method as recited in claim 11.

20. An apparatus for reducing effects of photoresist outgassing in an ion implanter, the apparatus comprising: an intermediate vacuum chamber located between a first portion of a magnet and a second portion of the magnet; and one or more pumping elements coupled to the intermediate vacuum chamber to enhance a vacuum level associated with the magnet.

21. The apparatus according to claim 20, wherein the first portion of the magnet and the second portion of the magnet cause ion trajectories to bend in a same direction.

22. The apparatus according to claim 20, wherein the first portion of the magnet and the second portion of the magnet cause ion trajectories to bend in opposite directions.

23. A method for reducing effects of photoresist outgassing in an ion implanter, the method comprising:
providing a first portion of a magnet and a second portion of the magnet;
positioning an intermediate vacuum chamber between the first portion and the second portion; and
pumping the intermediate vacuum chamber to enhance a vacuum level associated with the magnet.

* * * * *